United States Patent
Lin et al.

(10) Patent No.: US 9,362,460 B2
(45) Date of Patent: Jun. 7, 2016

(54) INTEGRATED POLARIZED LIGHT EMITTING DIODE WITH A BUILT-IN ROTATOR

(75) Inventors: Shawn-Yu Lin, Niskayuna, NY (US); Yong Sung Kim, Latham, NY (US); Mei-Li Hsieh, Troy, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 0 days.

(21) Appl. No.: 13/810,380

(22) PCT Filed: Jul. 19, 2011

(86) PCT No.: PCT/US2011/044512
§ 371 (c)(1),
(2), (4) Date: Mar. 12, 2013

(87) PCT Pub. No.: WO2012/012409
PCT Pub. Date: Jan. 26, 2012

(65) Prior Publication Data
US 2013/0161677 A1   Jun. 27, 2013

Related U.S. Application Data

(60) Provisional application No. 61/399,889, filed on Jul. 19, 2010.

(51) Int. Cl.
| H01L 33/32 | (2010.01) |
| H01L 33/46 | (2010.01) |
| H01L 33/58 | (2010.01) |
| G02B 5/30 | (2006.01) |
| G02B 5/32 | (2006.01) |
| G02B 5/18 | (2006.01) |

(52) U.S. Cl.
CPC ........ *H01L 33/46* (2013.01); *G02B 5/18* (2013.01); *G02B 5/30* (2013.01); *G02B 5/3008* (2013.01); *G02B 5/3058* (2013.01); *G02B 5/3083* (2013.01); *G02B 5/32* (2013.01); *H01L 33/58* (2013.01); *H01L 2933/0083* (2013.01)

(58) Field of Classification Search
CPC .......... G02B 5/3083; G02B 5/32; G02B 5/18; G02B 5/30; G02B 5/3008; H01L 2933/0083; H01L 33/58
USPC .......................................................... 257/13
See application file for complete search history.

(56) References Cited

U.S. PATENT DOCUMENTS

| 2004/0080805 A1* | 4/2004 | Levy .............................. 359/280 |
| 2004/0095637 A1* | 5/2004 | Nikolov et al. ............... 359/352 |
| 2005/0088084 A1 | 4/2005 | Cok |

(Continued)

OTHER PUBLICATIONS

International Search Report dated Nov. 25, 2011 for PCT/US2011/044512.

*Primary Examiner* — Minh-Loan Tran
*Assistant Examiner* — Farid Khan
(74) *Attorney, Agent, or Firm* — Heslin Rothenberg Farley & Mesiti P.C.

(57) ABSTRACT

The invention is directed to an integrated polarized light emitting diode device that has a light emitting diode, a metal grating, an oxide layer, and a built-in photonic crystal rotator. Additional teachings include a method for making the integrated polarized light emitting diode, a method for improving the polarization selectivity and energy efficiency of a light emitting diode, and a method for rotating polarization of a light emitting diode.

20 Claims, 7 Drawing Sheets

(56) References Cited

U.S. PATENT DOCUMENTS

| | | |
|---|---|---|
| 2005/0205884 A1* | 9/2005 | Kim et al. .................. 257/98 |
| 2008/0128727 A1* | 6/2008 | Erchak et al. ............... 257/98 |
| 2010/0133504 A1* | 6/2010 | Wang et al. ................. 257/13 |
| 2010/0150513 A1 | 6/2010 | Zhang et al. |
| 2010/0178480 A1* | 7/2010 | Colodrero Perez et al. .. 428/213 |

* cited by examiner

A

B

INTEGRATED POLARIZED LIGHT EMITTING DIODE WITH A BUILT-IN ROTATOR

CROSS-REFERENCE TO RELATED APPLICATIONS

This application is a National Phase filing of International Application No. PCT/US11/44512, filed Jul. 19, 2011, which claims priority to U.S. provisional patent application Ser. No. 61/399,889, filed Jul. 19, 2010. The entire content of each prior application is hereby incorporated by reference.

STATE AND FEDERAL FUNDED RESEARCH

The invention described herein was made with support of the National Science Foundation under Federal Grant Number EEC-0812056. The U.S. Government may have certain rights to this invention.

TECHNICAL FIELD

The present invention relates generally to light-emitting diodes (LEDs).

BACKGROUND OF THE INVENTION

Recent advances in semiconductor light sources are changing our daily lives. The classical light sources, such as incandescent and fluorescent light bulbs, are being replaced with light emitting diodes ("LEDs") that have improved energy efficiency and extended lifetime. Light emitting diode (LED) devices convert ultraviolet light rays or blue light rays emitted from an LED chip into visible light rays that have a longer wavelength. In addition to applications such as indicator lights on home and consumer appliances, audio visual equipment, telecommunication devices and automotive instrument markings, LEDs have found considerable application in indoor and outdoor informational displays. For example, LEDs are used as a backlight unit in liquid crystal displays ("LCDs") in conjunction with the technical advances in flat panel displays and growing demand in the marketplace for such products.

With the development of efficient LEDs that emit short wavelength (e.g., blue or ultraviolet (UV)) radiation, it has become feasible to produce LEDs that generate white light through down conversion (i.e., phosphor conversion) of a portion of the primary emission of the LED to longer wavelengths. Conversion of primary emissions of the LED to longer wavelengths is commonly referred to as down-conversion of the primary emission. An unconverted portion of the primary emission combines with the light of longer wavelength to produce white light.

Phosphor conversion of a portion of the primary emission of the LED chip is attained by placing a phosphor layer in an epoxy that is used to fill the reflector cup, which houses the LED chip within the LED lamp. The phosphor is in the form of a powder that is mixed into the epoxy prior to curing the epoxy. The uncured epoxy slurry containing the phosphor powder is then deposited onto the LED chip and is subsequently cured.

The phosphor particles within the cured epoxy generally are randomly oriented and interspersed throughout the epoxy. A portion of the primary radiation emitted by the LED chip passes through the epoxy without impinging on the phosphor particles, and another portion of the primary radiation emitted by the LED chip impinges on the phosphor particles, causing the phosphor particles to emit longer wavelength radiation. The combination of the primary short wavelength radiation and the phosphor-emitted radiation produces white light.

LED technology is inefficient in the visible spectrum. LEDs are becoming increasingly more popular because they are relatively efficient and eco-friendly. For example, LEDs are more widely used as light sources for vehicles, display apparatuses, optical communication systems, and illumination apparatuses. However, because polarization characteristics of light are often used in such application fields, all light emitted from LEDs is not actually used, thereby decreasing optical efficiency. Thus, there is a need in the art for energy efficient LEDs and how to make them.

SUMMARY OF THE INVENTION

The inventors of the instant application have discovered a new LED design that can greatly improve polarization selectivity, by at least 10:1, resulting in greater efficiency of the LED. The technology lies within a photonic crystal bi-refringent polarization rotator and an oxide spacer. The design blue-shifts transmission, which greatly improves overall efficiency of the LED by recycling wasted light and increasing polarization selectivity.

The present invention relates generally to light-emitting diode (LED) and specifically to the high polarization selectivity and the high energy efficiency achieved by rotating otherwise wasted polarizations to the desired polarization. In particular, the present invention discloses a light-emitting diode, a metal grating, an oxide spacer between the metal grating and the light-emitting diode, and a photonic crystal birefringent polarization rotator.

The present invention is directed to an integrated polarized light emitting diode device comprising: a light emitting diode, a metal grating, an oxide layer, and a built-in photonic crystal rotator. In one embodiment, the metal grating is selected from a group consisting of aluminum, iron, and copper. In another embodiment, the metal grating is made from aluminum. In one embodiment, the oxide layer is made from a single layer of silicon dioxide ("$SiO_2$"). In another embodiment, the built-in rotator is a crystal birefringent polarization rotator. In one embodiment, the photonic crystal consists of materials which have different refractive indices. In one embodiment, the photonic crystal of the polarized light emitting diode device comprises titanium dioxide ("$TiO_2$") with a refractive index of about 2.7, and $SiO_2$ with a refractive index of about 1.5.

In one embodiment, the metal grating of the polarized light emitting diode device is made of aluminum and the dimensions of the aluminum grating are such that the pitch is approximately 250 nm, the width is approximately 125 nm, and the height is approximately 125 nm. In one embodiment, the thickness of the oxide layer is approximately 100 nm and its refractive index is about 1.5.

One aspect of the present invention is directed to a method for improving the polarization selectivity and energy efficiency of a light emitting diode, said method comprising: a) generating light using a light emitting diode device; b) passing light with one direction of polarization through a metal grating on said light emitting diode device; c) passing light that does not pass through the metal grating through a photonic crystal that is built-in as part of said light emitting diode device; and d) optically rotating the polarization of said light to the desired polarization using the built-in photonic crystal rotator, such that high polarization selectivity is obtained and the energy efficiency of the light emitting diode is improved. In a related embodiment, the method further includes a step of recycling the rotated light such that the energy efficiency of the light emitting diode is improved and more light of the desired polarization exits the light emitting diode device through the metal grating.

In one embodiment, the light that exits the light emitting diode device through the metal grating reaches a sensor on the other side. In another embodiment, the built-in rotator is a crystal birefringent polarization rotator. In another embodiment, the polarization selectivity achieved is approximately 50:1 at $\lambda$=550 nm. In another embodiment, the polarization selectivity achieved by practicing the presently taught invention is approximately 20:1. In another embodiment, the polarization selectivity is approximately 30:1. In another embodiment, the polarization selectivity is approximately 40:1. In one embodiment, the polarization selectivity of the present invention is 50:1. In another embodiment, the polarization selectivity is 60:1. In another embodiment, the polarization selectivity is 70:1. In yet another embodiment, the polarization selectivity is 80:1. In another embodiment, the metal grating of the light emitting diode device is made of aluminum and the dimensions of the aluminum grating are such that the pitch is approximately 250 nm, the width is approximately 125 nm, and the height is approximately 125 nm.

One aspect of the present invention is directed to a method for rotating polarization of a light emitting diode, said method comprising: a) generating light using a light emitting diode device; b) passing light with one direction of polarization through a metal grating on said light emitting diode device; c) passing light that does not pass through the metal grating through a photonic crystal that is built-in as part of said light emitting diode device; and d) optically rotating the polarization of said light to the desired polarization using the built-in photonic crystal rotator. In a related embodiment, the method further includes a step of recycling the rotated light such that more light is polarized to the desired polarization.

One aspect of the present invention is directed to a method of making a polarized light emitting diode with a built-in rotator, said method comprising: a) assembling a birefingent photonic crystal optical rotator by a layer by layer method; b) adding a conventional light emitting diode on top of the photonic crystal optical rotator; c) adding an oxide layer on top of the light emitting diode; and d) adding a metal grating on top of the oxide layer. In one embodiment, these four steps are carried out sequentially.

In a related embodiment, the layer by layer method of step a) includes spin-coating a 300 nm thick bi-layer polymethyl methacrylate (PMMA) e-beam resist on a double-sided silicon substrate, exposing the resist-coated sample to a dosage of 900 pC/cm$^2$ and current of 20 nA, followed by development in a 1:3 mixture of methyl isobutyl ketone (MIBK) and isopropanol (ISP), and descum in an oxygen plasma. In another embodiment, step b) includes the conventional method of making a light emitting diode. In yet another embodiment, step c) includes deposition by evaporation, sputtering or spin coating of an oxide material.

DETAILED DESCRIPTION

Recently, light emitting diodes (LEDs) have started to replace the conventionally used lighting sources such as fluorescent lights and incandescent lights since their environmental soundness and high energy efficiency. However, many of existing applications already in market, such as a high efficient backlight of LCD, high-contrast bio-imaging, and low noise sensing require the light to be polarized. One aspect of the present invention is directed to the polarization control of LEDs and the task of achieving high polarization selectivity and recycling the wasted polarization.

A number of techniques have recently been reported for controlling the polarization of LEDs. For example, Schubert used an external reflector and achieved a 3:1 polarization selectivity. However, Schubert's device is bulky and angular dependent due to the external optics. In another study, Nakamura used internal strain field to split the degenerated valence-band and achieved maximum 6:1 polarization selectivity. However, this approach is limited by the strong wavelength dependency of the polarization selectivity, which means that this approach is not suitable for a broadband LED which produces white light covering all the visible wavelength regime (wavelength=420 to approximately 650 nm). Yang used a one-dimensional metal grating and achieved 2.5:1 selectivity. The grating is placed far away from the multiquantum-well and, as a result, acts as a lossy polarizer.

Figure 1:
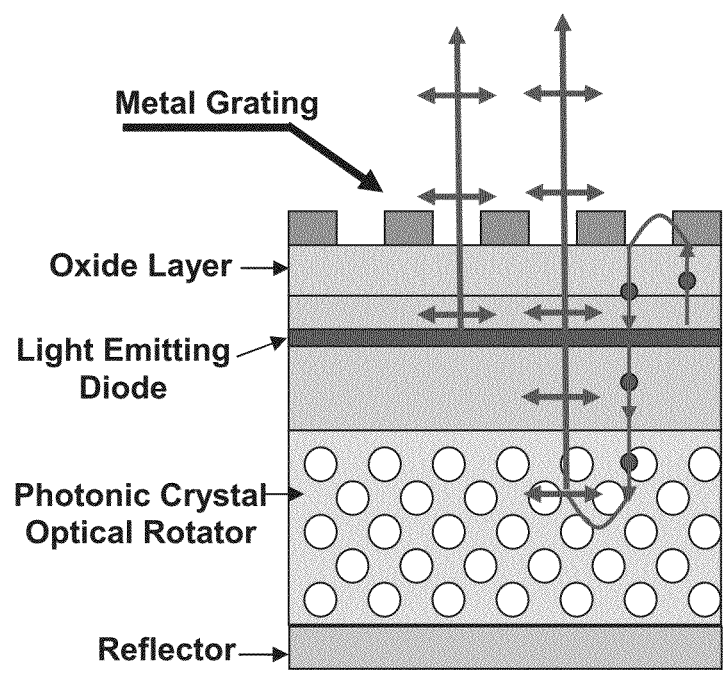
FIG. 1 shows a schematic design of the polarized LED.

Here, the inventors of the instant application have discovered a new LED design that can greatly improve polarization selectivity, by at least 10:1, resulting in greater efficiency of the LED. The technology lies within a photonic crystal bi-refringent polarization rotator and an oxide spacer. The design blue-shifts transmission, which greatly improves overall efficiency of the LED by recycling wasted light and increasing polarization selectivity. FIG. 1 shows a schematic design of the polarized LED. The design consists of three components: (1) top metal grating, (2) an oxide spacer between the grating and LED, and (3) a photonic crystal Bi-refringent polarization rotator.

FIG. 1 shows the schematic design of the polarized LED. The light generated by quantum wells inside an LED has two different polarizations. In the figure, one (short arrow) is perpendicular to the metal grating's bar direction and the other (dot) is parallel to it. The light with perpendicular polarization can be transmitted through the metal grating but the other polarization is reflected. The polarization direction of the reflected light with parallel polarization is changed to perpendicular direction when it goes through the photonic crystal optical rotator and reflected back to the metal grating. With this changed polarization, the light can pass through the metal grating. As such, the polarization selectivity is improved because the unwanted polarization is reused and converted to the desired polarization, thereby also improving the energy efficiency of the light emitting diode.

The role of the metal grating is to selectively transmit a desired polarization. The grating is designed, by reducing the pitch (a) less than the diffraction limit of the grating (a<420 nm), to avoid intrinsic diffraction. The thickness of the grating is less than 125 nm to minimize metallic absorption loss.

Figure 2:
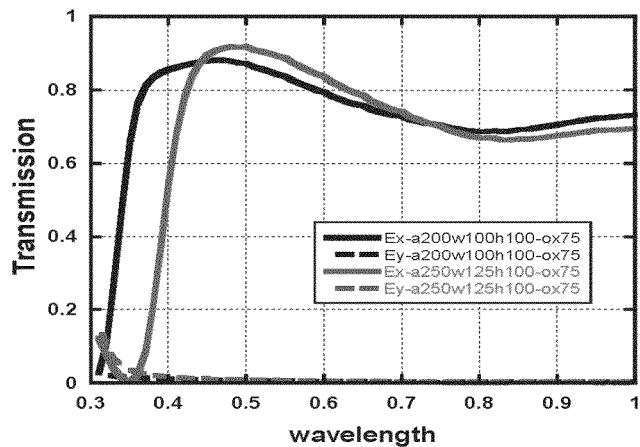
FIG. 2 shows the calculated transmission spectra of the design.
Figure 2:
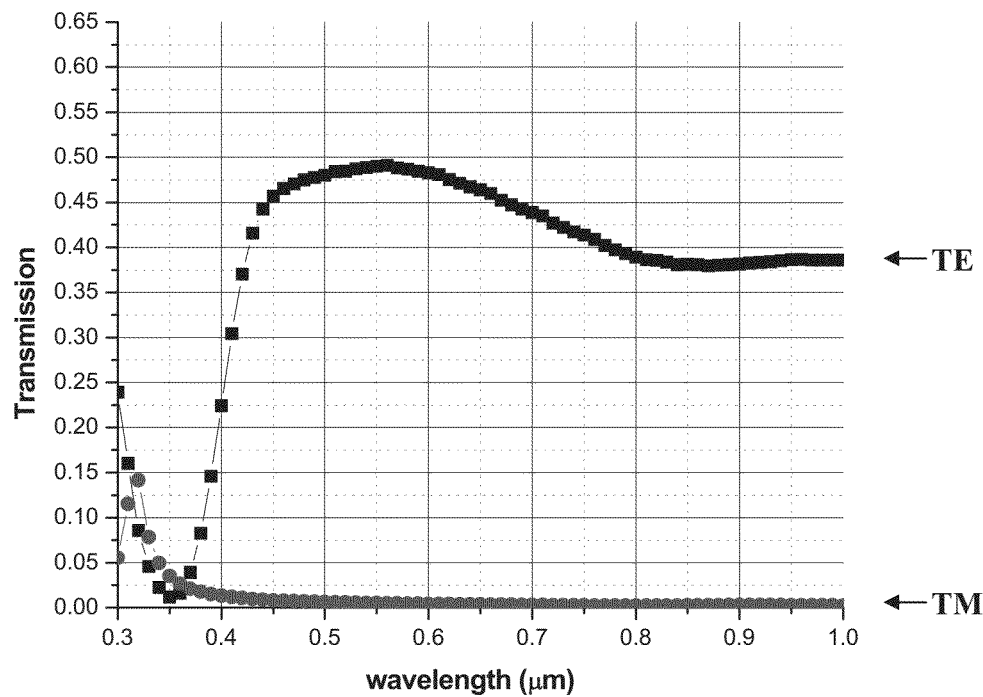

The role of the oxide spacer is to blue-shift the minimum wavelength of the transmittable light shorter than 420 nm which is the minimum visible wavelength. The oxide spacer reduces the effective optical index and can blue-shift the transmission edge. The calculated transmission spectra of the design are shown in FIG. 2. In FIG. 2A, two sets of resulting spectra are presented by changing the pitch (a) of the grating. The grating with a pitch of 200 nm shows a broadband high polarization selectivity (approximately 80:1) in the visible regime. In another example, the grating was designed to be at a pitch of 250 nm. This also shows similar broadband high polarization selectivity in the visible regime. In FIG. 2B, incident angle averaged (0-30 degrees) resulting transmission spectra are presented. An LED generates lights isotropically, not only normal to the grating, so need to see the incident angle dependency. The higher line graph (squares) is TE mode and the lower line graph (circles) is TM mode, depicting the polarization selectivity. In the figure TE polarization passes through the grating more than TM polarization. This shows the maximum polarization selectivity is approximately 50:1 at λ=0.55 μm (550 nm). As well as the advantage of the increased polarization selectivity, another advantage of the presently taught invention is that it provides for greater freedom to fabrication imperfection.

Figure 3:
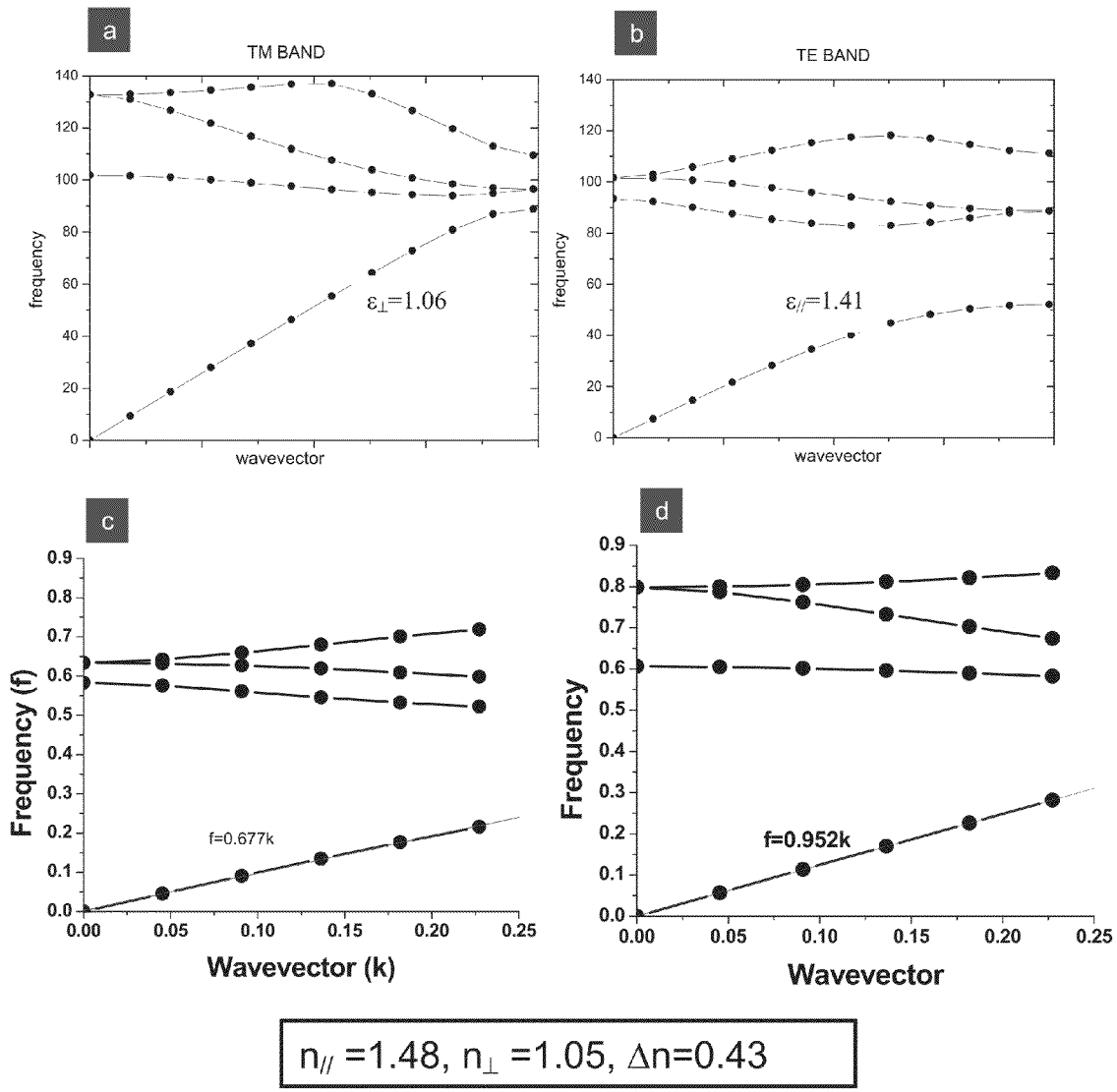
FIG. 3 shows photonic band diagrams of polarizations.

In FIG. 3 (a) and (b), an example of photonic band diagrams of two orthogonal polarizations are presented. Using these band diagrams, the appropriate dimension of the photonic crystal can be chosen. One can obtain the refractive indexes using the first band (the bottom first line) of the band diagram with the relation $$f = \frac{ck}{2\pi n},$$

where f is frequency, c is the velocity of light, k is wavevector, and n is refractive index. With the refractive indexes of the chosen photonic crystal and the following optical rotator equation, the polarization can be controlled as desired.

$$L = \frac{\lambda \Delta \theta}{\pi \Delta n},$$

where L is the thickness of the photonic crystal, Δθ is the rotation angle, and Δn is the bi-refringence. In FIG. 3 (c) and (d), the actual band diagrams of the presently taught invention are presented. The refractive indexes are $n_{//}=1.48$, $n_{\perp}=1.05$, and the birefringence $\Delta n = n_{//} - n_{\perp} = 0.43$. By controlling the thickness of the photonic crystal (L), we can control the polarization rotation angle (Δθ).

The photonic crystal bi-refringent rotator is used to rotate the direction of unwanted polarizations to the desired polarization. The intrinsic bi-refringence of a photonic crystal can be explained as follows: for wavelengths much larger than the lattice spacing of a photonic crystal, the dielectric arrays behave as effective media. Because of the ordered nature of the photonic crystal, the long-wavelength dielectric constants for the two orthogonal polarizations are given by:

$$\varepsilon_{//} = f_1 \varepsilon_1 + f_2 \varepsilon_2$$
$$\frac{1}{\varepsilon_\perp} = \frac{f_1}{\varepsilon_1} + \frac{f_2}{\varepsilon_2}$$

where f1 and f2 are the filling fractions of the two media with dielectric constants ∈1 and ∈2, respectively. In FIG. 3, photonic band diagrams of two orthogonal polarizations are presented. Using these band diagrams, the appropriate dimension of the photonic crystal is chosen. With the refractive indexes of the chosen photonic crystal and the following optical rotator equation, the polarization is controlled as desired.

$$L = \frac{\lambda \Delta \theta}{\pi \Delta n}$$

where L is the thickness of the photonic crystal, Δθ is the rotation angle, and Δn is the bi-refringence.

Figure 4:
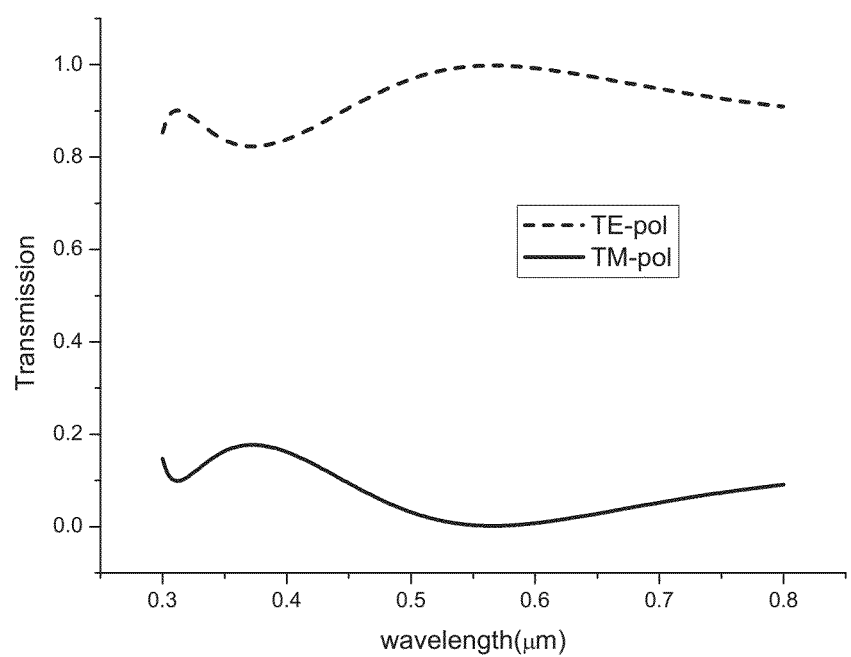
FIG. 4 shows the resulting polarization rotation.

FIG. 4 shows the resulting polarization rotation, where the thickness of the photonic crystal is 356 nm and the input polarization is TM only. Approximately 90% of the polarization is rotated to TE polarization after it goes through the photonic crystal rotator. The realization of the polarization rotator can be achieved by utilizing either 2D or 3D structure using a layer-by-layer fabrication method, as described in detail below.

To realize 3D photonic crystals in the optical wavelengths, numerous fabrication techniques including silicon micromachining, wafer bonding, direct laser write, and phase mask holography have been demonstrated to push 3D photonic bandgap down into the near-infrared regime. In the visible regime, pseudo-gaps have been achieved and studied through self-assembly and autocloning. The present inventors discovered that metallic structures can be used in reaching the visible.

The present inventors discovered and hereby teach an integrated polarized LED with a built-in rotator. This polarized LED comprises a top metal grating, an oxide spacer between the metal grating and the LED, and a photonic crystal bi-refringent polarization rotator. The inventors discovered that the oxide spacer can blue-shift the resulting transmission and it can greatly improve the polarization selectivity. Moreover, the inventors of the presently claimed invention discovered that the intrinsic bi-refringence property of a photonic crystal can be used to realize a polarization rotator. The photonic crystal can be either 2 dimensional or 3 dimensional structure and can be placed at the bottom or elsewhere in the design. Further, the inventors discovered that the rotated polarization can be recycled and by virtue of this process, the polarization selectivity and energy efficiency of the LED can be greatly improved. The broadband nature of the inventors' design operates over the entire blue, green and red spectrum.

Structure of Visible 3D Metallic Photonic Crystal and its Fabrication Process

Figure 5:
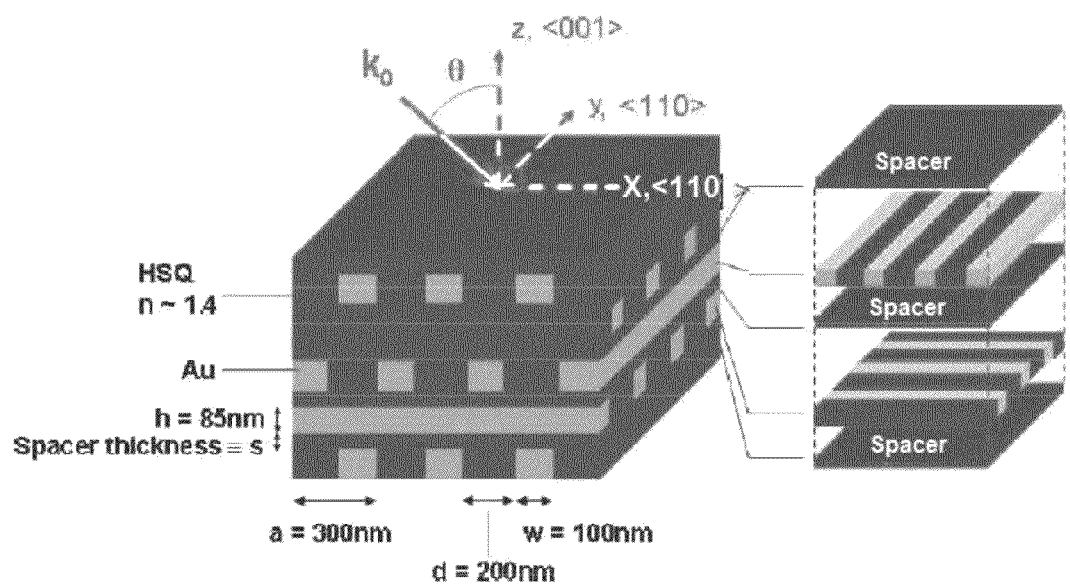
FIG. 5 shows a schematic of a 5-layer 3D metallo-dielectric photonic crystal that exhibits complete photonic bandgap down to visible wavelength of 650 nm and is shown to support non-localized propagating modes in the infrared far beyond the metallic waveguide cutoff.

FIG. 5 shows the sequence of the fabrication process using the layer-by-layer method as an example. The schematic of the 3D metallic photonic crystal slab used in this work is shown in FIG. 5. It is composed of a 5-layer gold modified-woodpile structure immersed in a dielectric material known as hydrogen silsesquioxane ("HSQ") (see Loboda et al., J. Electrochem. Soc., 145, 2861-2866 (1998)). HSQ is a spin-on-glass for use in planarization. Contrary to the original woodpile structure, the metallic rods in adjacent layers are non-touching and separated by a thin spacer layer of HSQ with thickness s, which is set to be 85 nm. The space between the gold rods in each layer is also filled with HSQ. The top layer of gold rods is capped by a thin film of HSQ. The thickness of the rods is the same in all 5 layers, as is that of the HSQ spacer. In FIG. 5, a is the grating period in each layer, w is the rod width, d is the inter-rod spacing, and h is the rod thickness. For measurement, light is incident from the top and makes an incident angle of 0 with the z-axis, where the z-axis denotes the (001) direction of the photonic crystal.

In one embodiment, gold was chosen as the metallic material as it has low absorption (less than 5% in an optically thick film) from infrared down to about 700 nm. It is also chemically inert and stable. In another embodiment, other metals such as silver are used.

The structure is fabricated layer-by-layer using electron beam (e-beam) lithography [Subramania and Lin, Appl. Phys. Lett., 85, 5037-5039, 2004]. First, a 300 nm thick bi-layer polymethyl methacrylate (PMMA) e-beam resist is spin-coated on a double-sided silicon substrate. The resist-coated sample then goes through direct e-beam exposure in a 100 kV Leica VB6 tool at a dosage of 900 pC/cm$^2$ and current of 20 nA. This is then followed by development in a 1:3 mixture of methyl isobutyl ketone (MIBK) and isopropanol (ISP), and descum in an oxygen plasma. Then, 5 nm of titanium (which acts as the adhesion layer) and 85 nm of gold are e-beam evaporated onto the sample, followed by liftoff in methylene chloride. This results in the first layer of gold gratings being patterned onto the substrate.

To planarize the structure for the next cycle to stack up another layer, a commercially available (Dow Corning) HSQ dissolved in MIBK is spun on with a thickness of 170 nm. SEM and AFM imaging show good step coverage and planarization. The HSQ is then cured at 350° C. for 1 hour on a hotplate at atmospheric pressure. The whole process is repeated for the next layer and the cycle can be carried out to the desired number of layers. Alignment between layers is achieved using gold alignment marks deposited in the same step as the first layer gratings. The total sample area is 5 mm×5 mm obtained by stitching 324 write fields, and the individual field size is around 300×300 micro meters.

Efficient light sources for photons in a well-defined polarization state substantially expand the control over the basic aspects of light. For practical matters, the polarization state of light matters whenever an anisotropic medium or material is illuminated. Specifically, emitters of linear polarized light are most suitable for pairing with polarized transmission modulators like nematic phase liquid crystals such as used in liquid crystal displays (LCDs). Avoiding the generation of light that cannot be transmitted by the modulator anyway can significantly enhance the display system's overall power efficiency.

In one embodiment of the present invention, an oxide spacer is used as part of the integrated polarized LED with a built-in rotator. The role of the oxide spacer is to blue-shift the minimum wavelength of the transmittable light shorter than 420 nm which is the minimum visible wavelength. The oxide spacer reduces the effective optical index and can blue-shift the transmission edge.

In one aspect of the present invention, the photonic crystal bi-refringent polarization rotator is built-in as part of the integrated polarized LED. In one embodiment, the LED device refers to the integrated polarized LED with the built-in photonic crystal bi-refringent polarization rotator. The photonic crystal bi-refringent polarization rotator rotates the direction of unwanted polarizations to a desired polarization using intrinsic bi-refringence of photonic crystals. For wavelengths much larger than the lattice spacing, scattering is less important and the photonic crystal behaves as an effective medium.

Due to the ordered nature of the arrays in the photonic crystal, the long wavelength dielectric constants for the two orthogonal polarizations are different. The refractive polarization dependent refractive index of the photonic crystal can be obtained by calculating the photonic band diagram (see figures). In the long wavelength (the first band), the dispersion relation of the first band is linear (since it behaves as an effective medium). One can calculate the refractive index using $$f = \frac{c}{2\pi n} k.$$

Figure 6:
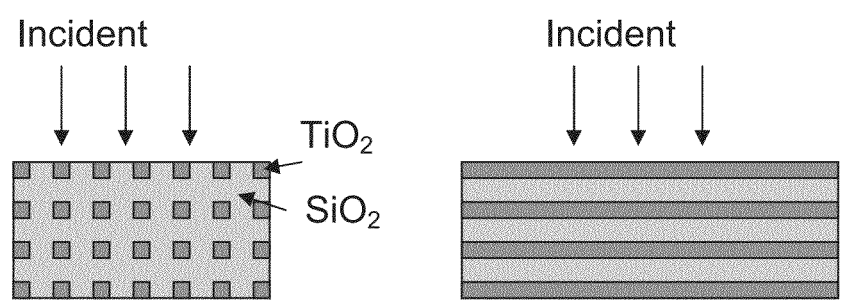
FIG. 6 shows the actual design of the photonic crystal optical rotator.

The actual design of the photonic crystal optical rotator is presented in FIG. 6. Two materials are used: $TiO_2$ and $SiO_2$. The photonic crystal consists of the materials which has different refractive index (high and low). The two materials are $TiO_2$ (n=2.7) and $SiO_2$ (n=1.5). These tow materials are transparent in visible light region and thus there's no loss by the materials. The rectangular shape of $TiO_2$ bars are embedded in the $SiO_2$ matrix. This can be fabricated by the layer-by-layer method outlined above. The dimensions of the photonic crystal include the distance between $TiO_2$ is at 125 nm, and the width and the height of $TiO_2$ are each 50 nm.

The shape of the $TiO_2$ is rectangular, so it can be fabricated easily with conventional lithography techniques. The effective refractive index ($n_{//}$=1.48, $n_\perp$=1.05) and the birefringence ($\Delta n = n_{//} - n_\perp$ =0.43) are calculated using the dispersion relation of the first band and an effective medium assumption is used in the long wave length region which is significantly longer than the lattice spacing. (see FIG. 6).

The present invention relates generally to light-emitting diode (LED) and specifically to the high polarization selectivity and the high energy efficiency achieved by rotating otherwise wasted polarizations to the desired polarization. The inventors of the present invention have discovered an integrated polarized light emitting diode device comprising: a light emitting diode, a metal grating, an oxide layer, and a built-in photonic crystal rotator. The presently taught invention teaches a method for improving the polarization selectivity and energy efficiency of a light emitting diode, said method comprising: a) generating light using a light emitting diode device; b) passing light with one direction of polarization through a metal grating on said light emitting diode device; c) passing light that does not pass through the metal grating through a photonic crystal that is built-in as part of said light emitting diode device; and d) optically rotating the polarization of said light to the desired polarization using the built-in photonic crystal rotator, such that high polarization selectivity is obtained and the energy efficiency of the light emitting diode is improved. In a related embodiment, the method further includes a step of recycling the rotated light such that the energy efficiency of the light emitting diode is improved and more light of the desired polarization exits the light emitting diode device through the metal grating.

In one embodiment, the polarization selectivity achieved by practicing the presently taught invention is approximately 20:1. In another embodiment, the polarization selectivity is approximately 30:1. In another embodiment, the polarization selectivity is approximately 40:1. In one embodiment, the polarization selectivity of the present invention is 50:1. In alternative embodiments, the polarization selectivity is 60:1, 70:1, or 80:1.

The inventors of the present application also teach a method for rotating polarization of a light emitting diode, comprising: a) generating light using a light emitting diode device; b) passing light with one direction of polarization through a metal grating on said light emitting diode device; c) passing light that does not pass through the metal grating through a photonic crystal that is built-in as part of said light emitting diode device; and d) optically rotating the polarization of said light to the desired polarization using the built-in photonic crystal rotator. In a related embodiment, the method further includes a step of recycling the rotated light such that more light is polarized to the desired polarization.

The present invention also teaches a method for making the polarized light emitting diode of the presently taught invention. In particular, the inventors teach a method of making a polarized light emitting diode with a built-in rotator, said method comprising: a) assembling a birefingent photonic crystal optical rotator by a layer by layer method; b) adding a conventional light emitting diode on top of the photonic crystal optical rotator; c) adding an oxide layer on top of the light emitting diode; and d) adding a metal grating on top of the oxide layer. In one embodiment, these four steps are carried out sequentially. This method allows for ease of fabrication and for mass production of the device at low cost.

The metal grating of the light emitting diode device is selected from a group consisting of aluminum, iron, and copper. In a particular example, the metal grating is made from aluminum. The oxide layer is made from a single layer of silicon dioxide ("$SiO_2$"), and the built-in rotator is a crystal birefringent polarization rotator. In one example, the photonic crystal consists of materials which have different refractive indices. In another example, the photonic crystal of the polarized light emitting diode device comprises titanium dioxide ("$TiO_2$") with a refractive index of about 2.7, and $SiO_2$ with a refractive index of about 1.5.

In the context of making the polarized light emitting diode of the presently taught invention, the metal grating of the polarized light emitting diode device is made of aluminum and the dimensions of the aluminum grating are such that the pitch is approximately 250 nm, the width is approximately 125 nm, and the height is approximately 125 nm. In one embodiment, the thickness of the oxide layer is approximately 100 nm and its refractive index is about 1.5. In one embodiment, the light that exits the light emitting diode device through the metal grating reaches a sensor on the other side. In another embodiment, the built-in rotator is a crystal birefringent polarization rotator. In another embodiment, the polarization selectivity achieved is approximately 50:1 at $\lambda=550$ nm. In yet another embodiment, the metal grating of the light emitting diode device is made of aluminum and the dimensions of the aluminum grating are such that the pitch is approximately 250 nm, the width is approximately 125 nm, and the height is approximately 125 nm.

In the context of the first step in the making of the polarized light emitting diode of the presently taught invention, the layer by layer method includes spin-coating a 300 nm thick bi-layer polymethyl methacrylate (PMMA) e-beam resist on a double-sided silicon substrate, exposing the resist-coated sample to a dosage of 900 $pC/cm^2$ and current of 20 nA, followed by development in a 1:3 mixture of methyl isobutyl ketone (MIBK) and isopropanol (ISP), and descum in an oxygen plasma. The second step in making the polarized light emitting diode of the presently taught invention includes the conventional method of making a light emitting diode, and the third step includes deposition by evaporation, sputtering or spin coating of an oxide material.

Each of the applications and patents cited in this text, as well as each document or reference cited in each of the applications and patents (including during the prosecution of each issued patent; "application cited documents"), and each of the PCT and foreign applications or patents corresponding to and/or paragraphing priority from any of these applications and patents, and each of the documents cited or referenced in each of the application cited documents, are hereby expressly incorporated herein by reference. More generally, documents or references are cited in this text, either in a Reference List before the paragraphs, or in the text itself; and, each of these documents or references ("herein-cited references"), as well as each document or reference cited in each of the herein-cited references (including any manufacturer's specifications, instructions, etc.), is hereby expressly incorporated herein by reference.

EXAMPLES

The invention, having been generally described, may be more readily understood by reference to the following examples, which are included merely for purposes of illustration of certain aspects and embodiments of the present invention, and are not intended to limit the invention in any way.

The applications of the present invention include, but are not limited to, backlight units of liquid crystal displays, low noise sensing and high-contrast bio-imaging.

Liquid crystal displays use a polarizer to transmit light with a direction of polarization and thus light with unwanted polarization is wasted. However, in the presently taught invention, the wasted polarization is reused by rotating its direction with the photonic crystal optical rotator. In the present invention, the light from the light emitting diode is already polarized, so there is no need for a polarizer. As such, the presently taught invention allows the operation of an LCD with approximately half amount of energy than conventional LCD containing devices. There are two polarizations TE (also called s-pol) and TM (also called p-pol). In the conventional setup, the polarizer will reflect one of the polarizations and be wasted. In contrast to the conventional approach, Applicants invention permits recycling of the wasted light and conversion of it to the desired polarization. As such, the energy consumption is approximately half of that used in the conventional setup.

Figure 7:
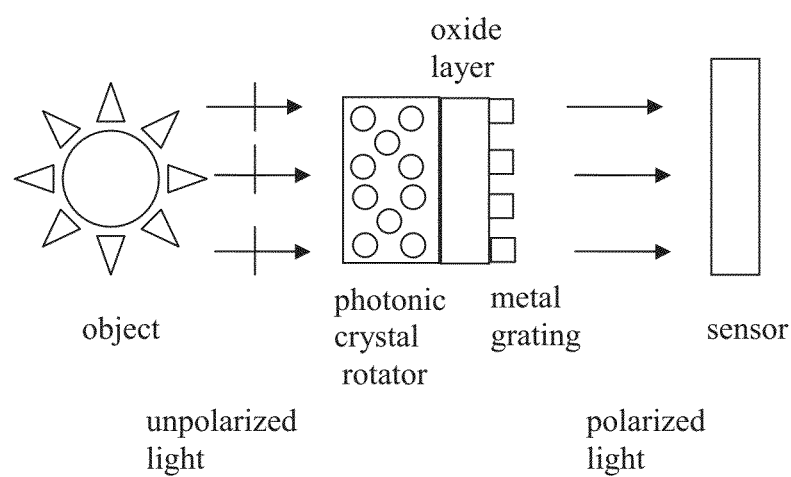
FIG. 7 shows a schematic of the low noise sensing and high contrast application of the presently taught invention.

For the low noise sensing and high contrast, light emitting component is excluded from FIG. 1. Only the metal grating, oxide layer and photonic crystal optical rotator are necessary. The combination of these three components can polarize light and as a result it is possible to reduce reflection and scattered light which are working as noise for the sensing purpose. FIG. 7 provides a schematic that demonstrates this principle.

The metal grating transmits light with only one direction of polarization, so light with other directions of polarization will be wasted. However, the photonic crystal bi-refringent polarization rotator rotates the direction of unwanted polarizations to a desired polarization using intrinsic bi-refringence of photonic crystals. This improves the energy efficiency of an LED for the applications which use polarized light such as LCD back light.

The photonic crystal consists of the materials having different refractive index (high and low). The two materials are $TiO_2$ (n=2.7) and $SiO_2$ (n=1.5). These two materials, titanium dioxide and silicon dioxide, are transparent in visible light region and thus there is minimal, if any, loss by these materials. The rectangular shape of $TiO_2$ bars are embedded in the $SiO_2$ matrix. This can be fabricated by a layer-by-layer method as described above.

The conventional 2D photonic crystal is a few microns. To use photonic crystal properties as intended in Applicants' invention, Applicants determined that the incident light should come into the side of the photonic crystal. Therefore, the inventors of the instant application rotated the 2D photonic crystal by 90 degrees, such that one can input light in the vertical direction. To realize this structure, the inventors adopted the layer-by-layer fabrication method, as outlined above.

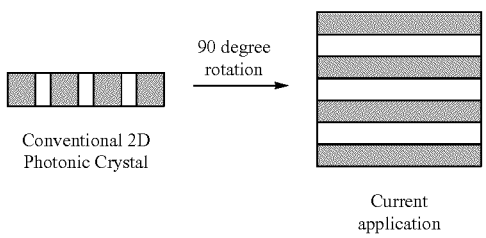

All publications, patents, and patent applications mentioned herein are hereby incorporated by reference in their entirety as if each individual publication or patent was specifically and individually indicated to be incorporated by reference. In case of conflict, the present application, including any definitions herein, will control. While several aspects of the present invention have been described and depicted herein, alternative aspects may be effected by those skilled in the art to accomplish the same objectives. Those skilled in the art will recognize, or be able to ascertain using no more than routine experimentation, many equivalents to the specific embodiments of the invention described herein. Accordingly, it is intended by the appended claims to cover all such alternative aspects as fall within the true spirit and scope of the invention.

The invention claimed is:

1. An integrated polarized light emitting diode device comprising: a light emitting diode, a metal grating, an oxide layer, and a built-in photonic crystal birefringent polarization rotator, wherein the built-in photonic crystal birefringent polarization rotator comprises a plurality of array layers interleaved with a plurality of layers comprising spacer material, each of the plurality of array layers comprises a plurality of rods parallel to each other and separated from each other by spacer material within the array layer, the plurality of rods comprises gold, silver, or $TiO_2$, and the plurality of rods in each of the plurality of array layers are rotated ninety degrees relative to the plurality of rods in an immediately successive array layer.

2. The polarized light emitting diode of claim 1, wherein said metal grating is selected from a group consisting of aluminum, iron, and copper.

3. The polarized light emitting diode of claim 1, wherein said oxide layer is made from a single layer of $SiO_2$.

4. The polarized light emitting diode of claim 1, wherein said rods comprise $TiO_2$ with a refractive index of about 2.7, and the spacer material comprises $SiO_2$ with a refractive index of about 1.5.

5. The polarized light emitting diode of claim 1, wherein the metal grating is made of aluminum and the dimensions of the aluminum grating are such that the pitch is approximately 250 nm, the width is approximately 125 nm, and the height is approximately 125 nm.

6. The polarized light emitting diode of claim 1, wherein the thickness of the oxide layer is approximately 100 nm and its refractive index is about 1.5.

7. A method for improving the polarization selectivity and energy efficiency of a light emitting diode, said method comprising:
  a. generating light using a light emitting diode device;
  b. passing light with one direction of polarization through a metal grating on said light emitting diode device;
  c. passing light that does not pass through the metal grating through a photonic crystal birefringent polarization rotator that is built-in as part of said light emitting diode device, wherein the photonic crystal birefringent polarization rotator comprises a plurality of array layers interleaved with a plurality of layers comprising a spacer material, each of the plurality of array layers comprises a plurality of rods parallel to each other and separated from each other by spacer material within the array layer, the plurality of rods comprises gold, silver, or $TiO_2$, and the plurality of rods in each of the plurality of array layers are rotated ninety degrees relative to the plurality of rods in an immediately successive array layer; and
  d. optically rotating the polarization of said light to the desired polarization using the built-in photonic crystal rotator, such that high polarization selectivity is obtained and the energy efficiency of the light emitting diode is improved.

8. The method of claim 7, wherein said method further includes a step of recycling the rotated light such that the energy efficiency of the light emitting diode is improved and more light of the desired polarization exits the light emitting diode device through the metal grating.

9. The method of claim 7, wherein said polarization selectivity is approximately 50:1 at $\lambda=550$ nm.

10. A method for rotating polarization of a light emitting diode, said method comprising:
  a. generating light using a light emitting diode device;
  b. passing light with one direction of polarization through a metal grating on said light emitting diode device;
  c. passing light that does not pass through the metal grating through a photonic crystal birefringent polarization rotator that is built-in as part of said light emitting diode device, wherein the photonic crystal birefringent polarization rotator comprises a plurality of array layers interleaved with a plurality of layers comprising a spacer material, each of the plurality of array layers comprises a plurality of rods parallel to each other and separated from each other by spacer material within the birefringent layer, the plurality of rods comprises gold, silver, or $TiO_2$ and the plurality of rods in each of the plurality of array layers are rotated ninety degrees relative to the plurality of rods in an immediately successive array layer; and
  optically rotating the polarization of said light to the desired polarization using the built-in photonic crystal rotator.

11. The method of claim 10, wherein said method further includes a step of recycling the rotated light such that more light is polarized to the desired polarization.

12. The method of claim 10, wherein the light is rotated to the desired polarization such that the polarization selectivity is approximately 50:1 at $\lambda=550$ nm.

13. The method of claim 10, wherein said metal grating is made of aluminum and the dimensions of the aluminum grating are such that the pitch is approximately 250 nm, the width is approximately 125 nm, and the height is approximately 125 nm.

14. A method of making a polarized light emitting diode with a built-in rotator, said method comprising:
  a. assembling a birefringent photonic crystal optical rotator by a layer by layer method, wherein assembling comprises depositing a plurality of array layers in alternation with depositing a plurality of layers comprising spacer material and depositing an array layer comprises forming a plurality of rods parallel to each other and separated from each other by spacer material within the array layer, the plurality of rods comprising gold, silver, or TiO$_2$, and orienting the plurality of rods in each succeeding array layer so as to be rotated ninety degrees relative to the plurality of rods in an immediately preceding array layer;

b. adding a conventional light emitting diode on top of the photonic crystal optical rotator;

c. adding an oxide layer on top of the light emitting diode; and d. adding a metal grating on top of the oxide layer.

15. The method of claim 14, wherein the layer by layer method of step a) includes spin-coating a 300 nm thick bi-layer polymethyl methacrylate (PMMA) e-beam resist on a double-sided silicon substrate, exposing the resist-coated sample to a dosage of 900 pC/cm$^2$ and current of 20 nA, followed by development in a 1:3 mixture of methyl isobutyl ketone (MIBK) and isopropanol (ISP), and descum in an oxygen plasma.

16. The method of claim 14, wherein said metal grating is selected from a group consisting of aluminum, iron, and copper.

17. The method of claim 14, wherein said oxide layer is made from a single layer of SiO$_2$.

18. The method of claim 14, wherein said rods comprise TiO$_2$ with a refractive index of 2.7, and the spacer material comprises SiO$_2$ with a refractive index of 1.5.

19. The method of claim 14, wherein the metal grating is made of aluminum and the dimensions of the aluminum grating are such that the pitch is approximately 250 nm, the width is approximately 125 nm, and the height is approximately 125 nm.

20. The method of claim 14, wherein the thickness of the oxide layer is approximately 100 nm and its refractive index is 1.5.

* * * * *